(12) United States Patent
Scheible

(10) Patent No.: US 6,798,217 B2
(45) Date of Patent: Sep. 28, 2004

(54) PROXIMITY SENSOR

(75) Inventor: Guntram Scheible, Hirschberg (DE)

(73) Assignee: ABB Research Ltd., Zurich (CH)

( * ) Notice: Subject to any disclaimer, the term of this patent is extended or adjusted under 35 U.S.C. 154(b) by 193 days.

(21) Appl. No.: 10/237,233

(22) Filed: Sep. 3, 2002

(65) Prior Publication Data
US 2003/0038641 A1 Feb. 27, 2003

Related U.S. Application Data

(63) Continuation of application No. PCT/EP01/01865, filed on Feb. 20, 2001.

(30) Foreign Application Priority Data

Mar. 2, 2000 (DE) .......................................... 100 10 094
Jul. 6, 2000 (DE) .......................................... 100 32 864

(51) Int. Cl.[7] ...................... H01H 47/00; H03K 17/945; G08B 21/00; B60Q 1/00
(52) U.S. Cl. .................... 324/654; 340/435; 340/686.6; 327/517; 307/125
(58) Field of Search .............................. 324/654, 158.1; 331/65; 307/116, 125; 340/5.61, 5.62, 5.63, 5.64, 5.5, 539.23, 686.6, 903, 435, 436; 327/517; 439/950; 174/50, 52.1; 180/167, 169; 701/29, 35; 367/909, 91

(56) References Cited

U.S. PATENT DOCUMENTS

| 3,719,898 | A |   | 3/1973  | Clarke ........................... 331/65 |
| 4,654,471 | A | * | 3/1987  | Masaki et al. ................. 174/50 |
| 4,673,827 | A | * | 6/1987  | Sommer ....................... 307/116 |
| 4,757,213 | A |   | 7/1988  | Tigges et al. ................. 307/116 |
| 5,218,311 | A |   | 6/1993  | Jagiella et al. ............... 324/683 |
| 5,970,227 | A | * | 10/1999 | Dayan et al. ................. 713/200 |
| 6,043,774 | A | * | 3/2000  | Singh et al. .................. 342/127 |

FOREIGN PATENT DOCUMENTS

| DE | 28 19 782 A1  | 11/1979 |
| DE | 33 18 900 A1  | 11/1984 |
| DE | 39 07 285 A1  |  9/1990 |
| DE | 40 16 400 A1  | 11/1991 |
| DE | 40 17 232 A1  | 12/1991 |
| DE | 197 55 924 A1 |  7/1999 |
| FR | 2 694 414     |  2/1994 |

OTHER PUBLICATIONS

"Low Voltage Systems and Products", *ABB Catalogue No. 1SAC103699L0201*, dated Jun. 1999, pp. VI and VII.

* cited by examiner

Primary Examiner—Donald M. Lair
(74) Attorney, Agent, or Firm—Laurence A. Greenberg; Werner H. Stemer; Gregory L. Mayback

(57) ABSTRACT

A proximity sensor with a sensor head for generating sensor signals is described. The proximity sensor is divided into a fastening portion containing a sensor head, and an electronics portion that can be connected to the fastening portion and has at least a sensor-signal evaluation unit and a power supply. The sensor signals pass from the fastening portion to the electronics portion via electrical contacts or contactlessly. Furthermore, a modular system for forming proximity sensors is proposed, and contains a multiplicity of fastening portions, respectively containing a sensor head, with different dimensioning and, connectable herewith, in each case identical electronics portions.

10 Claims, 2 Drawing Sheets

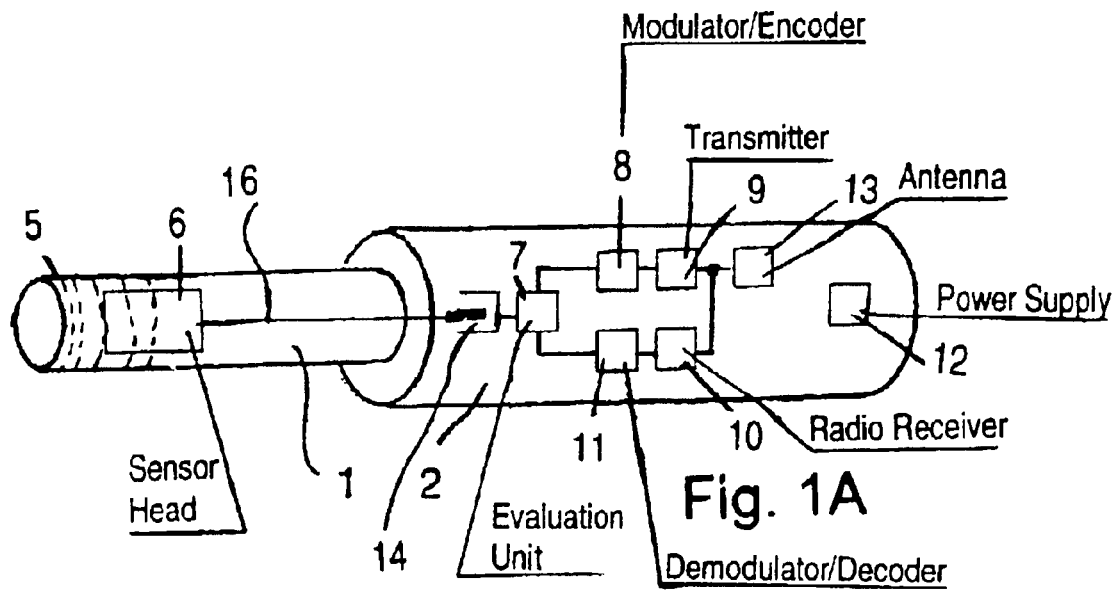
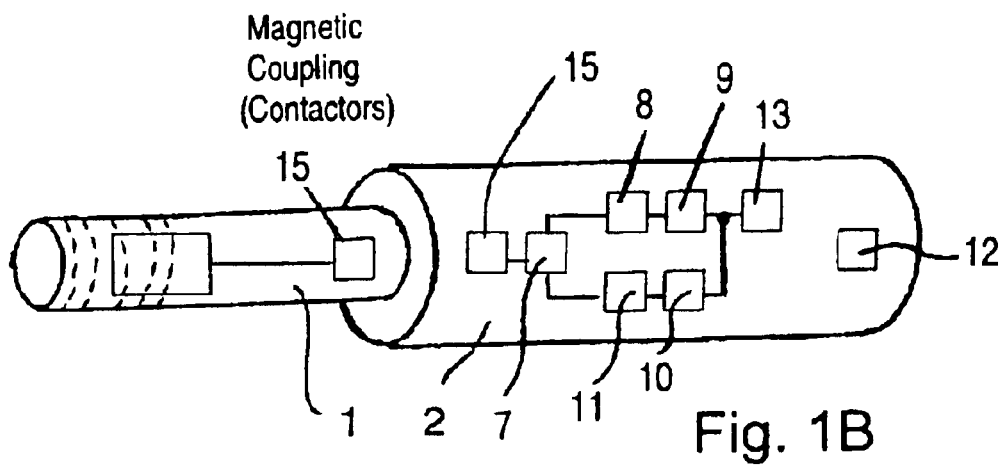

PROXIMITY SENSOR

CROSS-REFERENCE TO RELATED APPLICATION

This application is a continuation of copending International Application No. PCT/EP01/01865, filed Feb. 20, 2001, which designated the United States and was not published in English.

BACKGROUND OF THE INVENTION

Field of the Invention

The invention relates to a proximity sensor with a sensor head for generating sensor signals and to a modular system for forming proximity sensors.

A proximity sensor is known, for example, from Published, Non-Prosecuted German Patent Application DE 33 18 900 A1. In the case of the known proximity sensor, a mini-transmitter that passes on the sensor signal wirelessly to another unit is already used.

It is generally known to produce proximity sensors with different outer forms, for example with a cylindrical housing of a diameter of 4, 6, 8, 12, 18 and 30 mm or else with a cuboidal housing (see in this respect, for example, ABB catalogue No. 1SAC103699L0201, printed 6/99, pages VI and VII). The outer form of the housing corresponds to the fastening openings to be provided in machine components. In the case of cylindrical housings, the housing diameter is often chosen in accordance with the sensor spacing. In this case, it is difficult, in particular in the case of very small diameters of the housing, to accommodate not only the sensor head with the sensor coil and a sensor-signal evaluation unit but also additional electronic units, such as a radio transmitter, radio receiver and antenna, within the housing.

SUMMARY OF THE INVENTION

It is accordingly an object of the invention to provide a proximity sensor which overcomes the above-mentioned disadvantages of the prior art devices and methods of this general type, which can be adapted in a simple way to differently dimensioned fastening openings.

With the foregoing and other objects in view there is provided, in accordance with the invention, a proximity sensor. The proximity sensor includes a fastening portion containing a sensor head for generating sensor signals, and an electronics portion connectable to the fastening portion. The electronics portion has a sensor-signal evaluation unit, a modulator/encoder, a radio transmitter with an antenna for emitting evaluated sensor signals and disposed downstream of the modulator/encoder, a radio receiver, a demodulator/decoder for a radio reception of sets of parameters and disposed downstream of the radio receiver, and a power supply unit. An electrical connection is provided for passing the sensor signals from the fastening portion to the electronics portion.

The advantages that can be achieved with the invention are, in particular, that the electronics portion of the proximity sensor, formed as an independent structural component, can be used universally for all variants of the fastening portions, formed as independent structural components (with different housing diameters or different housing configurations). The electronics of the proximity sensor, including the sensor-signal evaluation unit, radio transmitter, antenna and cableless power supply, does not have to be miniaturized in such a way that it also fits in fastening portions with extremely small dimensions (see, for example, proximity sensors with a cylindrical housing of 4 or 6 mm in diameter). The modular system makes it possible for proximity sensors to be produced at low cost with different fastening portions, respectively adapted to the fastening openings of machine components, it being possible in each case for the same electronics portions to be used for different fastening portions.

In accordance with an added feature of the invention, the power supply unit contains a secondary coil, a rectifier disposed downstream of the secondary coil, and a store. The secondary coil receives a medium-frequency magnetic field and performs a conversion of the medium-frequency magnetic field into electrical energy.

In accordance with an additional feature of the invention, the fastening portion has a thread suitable for engagement in a machine component.

In accordance with another feature of the invention, the electrical connection between the fastening portion and the electronics portion includes plug contacts. Alternatively, the electrical connection takes place by magnetic coupling.

In accordance with a further feature of the invention, the electrical connection includes an intermediate piece connected between the fastening portion and the electronics portion. Preferably, the intermediate piece is deformable.

In accordance with another added feature of the invention, the sensor-signal evaluation unit adaptively recognizes a connection of the sensor head for evaluating the sensor signals.

In accordance with a concomitant feature of the invention, the electrical connection between the fastening portion and the electronics portion takes place contactlessly or with electrical contacts.

Other features which are considered as characteristic for the invention are set forth in the appended claims.

Although the invention is illustrated and described herein as embodied in a proximity sensor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 1A and 1B are diagrammatic, perspective views of a first embodiment of a pluggable proximity sensor according to the invention;

DESCRIPTION OF THE PREFERRED EMBODIMENTS

Figure 2:
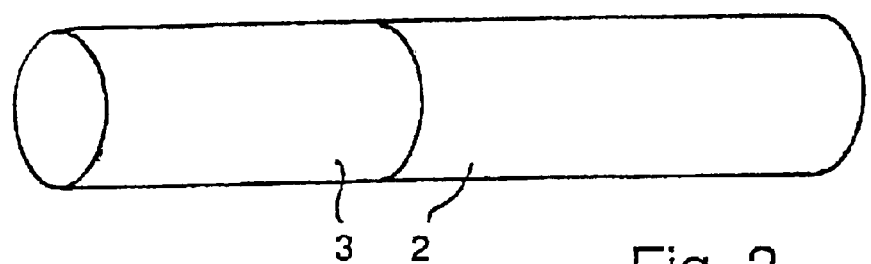
FIG. 2 is a perspective view of a second embodiment of the pluggable proximity sensor.

Referring now to the figures of the drawing in detail and first, particularly, to FIGS. 1A and 1B thereof, there is shown a first embodiment of a pluggable proximity sensor. The proximity sensor is made up of two structural components that can be connected to each other, to be specific a fastening portion 1 and an electronics portion 2. The cylindrical fastening portion 1, preferably formed of metal, serves for fastening a sensor head 6 which detects a sensor environment, in a bore or generally a fastening opening of a machine component and, for this purpose, is preferably provided with a thread 5. The fastening portion 1 in the case of an inductive proximity sensor contains a sensor coil and, if appropriate, a resonant capacitor.

The electronics portion 2, preferably provided with a plastic housing, contains a sensor-signal evaluation unit 7, required for the evaluation of a sensor signal, a modulator/encoder 8, required for the conversion of an evaluated sensor signal, and a transmitter 9 with an antenna 13 (generally a device for radio transmission to a remote device), serving for the emission of radio signals. The electronics portion 2 expediently contains in addition a radio receiver 10 for receiving sets of parameters (sensor switching thresholds, switching hystereses, correction factors for different materials to be identified, prescribed distance ranges between the sensor and an object to be identified) and a downstream demodulator/decoder 11 for conditioning the received signal, storing it and feeding it to the sensor-signal evaluation unit 7. Furthermore, the electronics portion 2 contains a power supply unit 12 required for cableless power feeding and supply.

Figure 4:
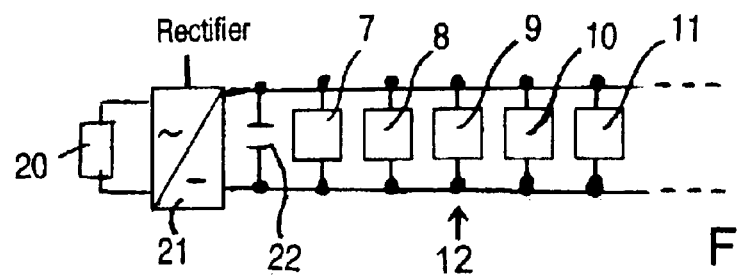
FIG. 4 is a block diagram of a power supply unit.

The power supply unit 12 preferably contains a secondary coil 20, a downstream rectifier 21 and a store 22, for example a capacitor 22 for energy storage (FIG. 4). The power supplied to the rest of the proximity sensor from the power supply unit 12 preferably takes place in a pulsed manner with a prescribed on period and a prescribed off period, which has the advantage of optimizing or reducing the energy requirement. A base station, corresponding to the proximity sensor, expediently contains an oscillator, which feeds a primary coil with a medium-frequency oscillation in the range from approximately 15 kHz to 15 MHz, whereby a magnetic field is generated. The secondary coil of the power supply unit 12 receives the medium-frequency magnetic field and performs the conversion from magnetic energy into electrical energy.

The specified medium frequency would lead to the emission of electromagnetic fields of wavelengths greater than 22 m to 22 km, and consequently greater than the dimension of the primary winding used, so that the primary winding does not act as an antenna for such electromagnetic radiation on account of its dimensions.

In FIG. 2, a second embodiment of the pluggable proximity sensor is represented. The proximity sensor shown is constructed in principle in the same way as the first embodiment, explained above under FIG. 1, but a fastening portion 3 used has a greater diameter than the fastening portion 1 according to FIG. 1. The example is intended to show that all the required fastening portions can be realized with cylindrical housings of different diameters or with housings of different forms and can be connected in a simple way to the universal electronics portion 2.

The electrical connection between the two structural components of the proximity sensor, the fastening portion 1 or 3 and the electronics portion 2, preferably takes place by electrical wiring 16 and plug contacts 14, but may also take place contactlessly by magnetic coupling 15, which has the advantage of greater reliability. The sensor-signal evaluation unit 7 can adaptively recognize the connected sensor head 6 and evaluate the transmitted sensor signals accordingly. For the adaptation of the sensor-signal evaluation unit 7 to the connected sensor head 6, additional contacts are provided, for example, for the connection of the two structural components, the fastening portion 1 or 3 and the electronics portion 2.

Figure 3:
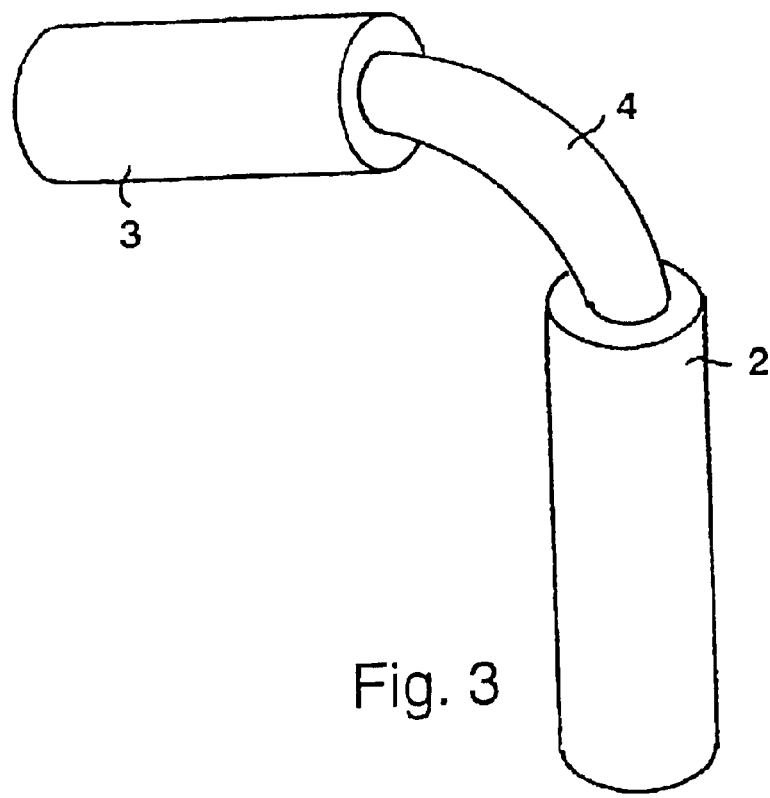
FIG. 3 is a perspective view of a third embodiment of the pluggable proximity sensor.

When there is restricted installation space, an intermediate piece 4 may be additionally inserted between the fastening portion 1 or 3 and the electronics portion 2, as a third embodiment of a pluggable proximity sensor shown in FIG. 3. In the case of this embodiment, the proximity sensor is accordingly made up of three structural components that can be connected to one another. The electrical connections preferably take place by plug contacts. The intermediate piece 4 is expediently deformable, so that an exact adaptation to the available installation space is possible.

The invention can also be used in particular in the case of an industrial robot, an automatic production machine, an automatic manufacturing machine or an automation system which has a multiplicity of proximity sensors/proximity switches (system) with different fastening openings, a radio transmission being provided between the individual proximity sensors and a central station with a connected process computer for the transmission of the sensor signals and, if appropriate, for the transmission of sets of parameters.

I claim:

1. A proximity sensor, comprising:
   a fastening portion containing a sensor head for generating sensor signals;
   an electronics portion connectable to said fastening portion, said electronics portion having a sensor-signal evaluation unit, a modulator/encoder, a radio transmitter with an antenna for emitting evaluated sensor signals and disposed downstream of said modulator/encoder, a radio receiver, a demodulator/decoder for a radio reception of sets of parameters and disposed downstream of said radio receiver, and a power supply unit; and
   an electrical connection for passing the sensor signals from said fastening portion to said electronics portion.

2. The proximity sensor according to claim 1, wherein said power supply unit contains a secondary coil, a rectifier disposed downstream of said secondary coil, and a store, said secondary coil receiving a medium-frequency magnetic field and performing a conversion of the medium-frequency magnetic field into electrical energy.

3. The proximity sensor according to claim 1, wherein said fastening portion has a thread suitable for engagement in a machine component.

4. The proximity sensor according to claim 1, wherein said electrical connection between said fastening portion and said electronics portion includes a plug contact.

5. The proximity sensor according to claim 1, wherein said electrical connection between said fastening portion and said electronics portion takes place by magnetic coupling.

6. The proximity sensor according to claim 1, wherein said electrical connection includes an intermediate piece connected between said fastening portion and said electronics portion.

7. The proximity sensor according to claim 6, wherein said intermediate piece is deformable.

8. The proximity sensor according to claim 1, wherein said sensor-signal evaluation unit adaptively recognizes a connection of said sensor head for evaluating the sensor signals.

9. The proximity sensor according to claim 1, wherein said electrical connection between said fastening portion and said electronics portion takes place contactlessly.

10. The proximity sensor according to claim 1, wherein said electrical connection includes electrical contacts for connecting said fastening portion to said electronics portion.

* * * * *